US012580526B2

(12) United States Patent
Scott et al.

(10) Patent No.: US 12,580,526 B2
(45) Date of Patent: Mar. 17, 2026

(54) POWER AMPLIFIER WITH CLAMP AND FEEDBACK PROTECTION CIRCUITRY

(71) Applicant: Qorvo US, Inc., Greensboro, NC (US)

(72) Inventors: Baker Scott, San Jose, CA (US);
Chong Woo, Fremont, CA (US);
George Maxim, Saratoga, CA (US);
Sukchan Kang, San Francisco, CA
(US); Hui Liu, San Diego, CA (US)

(73) Assignee: Qorvo US, Inc., Greensboro, NC (US)

( * ) Notice: Subject to any disclaimer, the term of this
patent is extended or adjusted under 35
U.S.C. 154(b) by 536 days.

(21) Appl. No.: 17/805,316

(22) Filed: Jun. 3, 2022

(65) Prior Publication Data

US 2023/0253930 A1 Aug. 10, 2023

Related U.S. Application Data

(60) Provisional application No. 63/307,387, filed on Feb.
7, 2022.

(51) Int. Cl.
*H03F 1/52* (2006.01)
*H03F 1/02* (2006.01)
*H03F 3/20* (2006.01)

(52) U.S. Cl.
CPC ............. *H03F 1/52* (2013.01); *H03F 1/0205*
(2013.01); *H03F 3/20* (2013.01);
(Continued)

(58) Field of Classification Search
CPC ........ H03F 1/52; H03F 2200/426; H03F 3/20;
H03F 1/0205; H03F 2200/441;
(Continued)

(56) References Cited

U.S. PATENT DOCUMENTS 3,641,451 A 2/1972 Hollingsworth et al.
4,122,400 A 10/1978 Medendorp et al.
(Continued)

FOREIGN PATENT DOCUMENTS

CN 112803901 A 5/2021
CN 113746440 A * 12/2021 ............... H03F 1/30
(Continued)

OTHER PUBLICATIONS

Ligtao et al., Implementation of On-chip OVP, OCP and OTP
Circuits for DC-DC Converter Design, 2018, IEEE (Year: 2018).*
(Continued)

*Primary Examiner* — Andrea Lindgren Baltzell
*Assistant Examiner* — Lance Torbjorn Bartol
(74) *Attorney, Agent, or Firm* — Withrow & Terranova,
P.L.L.C.

(57) ABSTRACT

A power amplifier with clamp and feedback protection
circuitry is disclosed. In one aspect, the power amplifier is
initially protected by a fast-acting clamp circuit whose
overall size is relatively limited. Subsequent operation
allows a comparatively slowly acting feedback loop to
dominate the protection of the power amplifier. By provid-
ing the two protection circuits, each optimized for a par-
ticular phase of protection, the overall size of associated
protection circuitry may be diminished while still protecting
the power amplifier from failure inducing conditions.

14 Claims, 11 Drawing Sheets

(52) U.S. Cl.
CPC .. *H03F 2200/426* (2013.01); *H03F 2200/441* (2013.01); *H03F 2200/444* (2013.01); *H03F 2200/447* (2013.01); *H03F 2200/451* (2013.01); *H03F 2200/462* (2013.01); *H03F 2200/465* (2013.01); *H03F 2200/468* (2013.01); *H03F 2200/471* (2013.01)

(58) Field of Classification Search
CPC ......... H03F 2200/444; H03F 2200/451; H03F 2200/447; H03F 2200/462; H03F 2200/465; H03F 2200/468; H03F 200/471

USPC ........................................................ 330/291

See application file for complete search history.

(56) References Cited

U.S. PATENT DOCUMENTS

| | | | |
|---|---|---|---|
| 4,893,158 A | 1/1990 | Mihara et al. | |
| 5,847,610 A | 12/1998 | Fujita | |
| 6,469,919 B1 | 10/2002 | Bennett | |
| 7,193,459 B1 | 3/2007 | Epperson et al. | |
| 7,268,990 B1 | 9/2007 | Loeb et al. | |
| 7,852,063 B2 | 12/2010 | Kobayashi et al. | |
| 8,344,806 B1 | 1/2013 | Franck et al. | |
| 8,586,256 B2 | 11/2013 | Yanase et al. | |
| 9,960,594 B1 * | 5/2018 | Lin | H02M 1/32 |
| 10,027,287 B1 | 7/2018 | Ichitsubo et al. | |
| 10,291,191 B2 | 5/2019 | Teeter et al. | |
| 10,965,225 B2 | 3/2021 | Hashimoto et al. | |
| 11,218,116 B2 | 1/2022 | Ng et al. | |
| 11,728,773 B2 | 8/2023 | Gebeyehu et al. | |
| 11,799,327 B2 | 10/2023 | Marr, Jr. et al. | |
| 2002/0125945 A1 | 9/2002 | Taylor | |
| 2004/0239428 A1 | 12/2004 | Apel | |
| 2008/0239597 A1 | 10/2008 | Van Bezooijen et al. | |
| 2011/0292554 A1 | 12/2011 | Yao et al. | |
| 2012/0038415 A1 | 2/2012 | Vanhoucke et al. | |
| 2015/0015339 A1 | 1/2015 | Gorbachov et al. | |
| 2015/0070092 A1 * | 3/2015 | Ishimoto | H03F 3/193 |
| | | | 330/296 |
| 2015/0349723 A1 | 12/2015 | Kwon et al. | |
| 2017/0126184 A1 | 5/2017 | Oh et al. | |
| 2019/0036495 A1 | 1/2019 | Ng et al. | |
| 2019/0068137 A1 | 2/2019 | Wang | |
| 2019/0207577 A1 | 7/2019 | Zhao | |
| 2019/0363681 A1 | 11/2019 | Saegusa | |
| 2020/0099457 A1 * | 3/2020 | Lübbers | H03F 1/32 |
| 2020/0335491 A1 * | 10/2020 | Sasaki | H01L 24/17 |
| 2021/0211108 A1 | 7/2021 | Khlat | |
| 2021/0226589 A1 | 7/2021 | Han | |
| 2021/0281228 A1 | 9/2021 | Khlat | |
| 2021/0399691 A1 | 12/2021 | Saminathan et al. | |
| 2022/0200542 A1 * | 6/2022 | Tsutsui | H03F 3/245 |
| 2023/0094883 A1 | 3/2023 | Scott et al. | |
| 2023/0096011 A1 | 3/2023 | Scott et al. | |
| 2023/0387867 A1 | 11/2023 | Maxim et al. | |

FOREIGN PATENT DOCUMENTS

| | | | |
|---|---|---|---|
| CN | 114070212 A | 2/2022 | |
| EP | 3651357 A1 | 5/2020 | |
| EP | 3843264 A1 | 6/2021 | |
| FR | 3107410 A1 | 8/2021 | |
| JP | S64-068005 S | 3/1989 | |
| JP | H0479505 A | 3/1992 | |
| JP | H09162649 A | 6/1997 | |
| JP | 2006501743 A | 1/2006 | |
| JP | 2008294977 A | 12/2008 | |
| JP | 2011176592 A | 9/2011 | |
| JP | 2013102490 A | 5/2013 | |
| JP | 2019208092 A | 12/2019 | |
| JP | 2020516194 A | 5/2020 | |
| JP | 2023529847 A | 7/2023 | |
| WO | 9419870 A1 | 9/1994 | |
| WO | 9531035 A1 | 11/1995 | |
| WO | 2008030534 A2 | 3/2008 | |
| WO | 2010135711 A1 | 11/2010 | |
| WO | 2013099077 A1 | 7/2013 | |
| WO | 2023164036 A1 | 8/2023 | |

OTHER PUBLICATIONS

Non-Final Office Action for U.S. Appl. No. 17/488,823, mailed Mar. 7, 2024, 9 pages.

Non-Final Office Action for U.S. Appl. No. 17/488,877, mailed Apr. 25, 2024, 21 pages.

1 Extended European Search Report for European Patent Application No. 23155394.2, mailed Jul. 6, 2023, 12 pages.

Notice of Allowance for U.S. Appl. No. 17/488,823, mailed Aug. 21, 2024, 8 pages.

Notice of Allowance for U.S. Appl. No. 17/488,877, mailed Jul. 26, 2024, 8 pages.

International Search Report and Written Opinion for International Patent Application No. PCT/US2023/025554 mailed Oct. 5, 2023, 15 pages.

International Search Report and Written Opinion for International Patent Application No. PCT/US2023/013683, mailed Jun. 9, 2023, 16 pages.

Van Bezooijen, A. et al., "Over-Temperature Protection by Adaptive Output Power Control," Proceedings of the 9th European Conference on Wireless Technology, Sep. 2006, Manchester, UK, pp. 350-352.

International Search Report and Written Opinion for International Patent Application No. PCT/US2022/044114, mailed Jan. 11, 2023, 18 pages.

International Search Report and Written Opinion for International Patent Application No. PCT/US2022/044040, mailed Jan. 17, 2023, 17 pages.

Written Opinion for International Patent Application No. PCT/US2022/044114, mailed Oct. 30, 2023, 21 pages.

International Preliminary Report on Patentability for International Patent Application No. PCT/US2022/044114, mailed Dec. 22, 2023, 19 pages.

Extended European Search Report for European Patent Application No. 23171644.0, mailed Oct. 27, 2023, 14 pages.

* cited by examiner

POWER AMPLIFIER WITH CLAMP AND FEEDBACK PROTECTION CIRCUITRY

PRIORITY CLAIM

The present application claims priority to U.S. Provisional Patent Application Ser. No. 63/307,387 filed on Feb. 7, 2022 and entitled "5G POWER AMPLIFIER WITH HYBRID PROTECTION SCHEME, FAST CLAMP AND SLOW FEEDBACK LOOP FOR SMALLER SIZE AND BETTER RUGGEDNESS," the contents of which is incorporated herein by reference in its entirety.

BACKGROUND

I. Field of the Disclosure

The technology of the disclosure relates generally to power amplifiers and particularly to power amplifiers with protection circuitry.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to increase bandwidth for wireless communication that facilitates these functions. Accordingly, cellular wireless standards have evolved into the fifth-generation new radio (5G-NR) standards. These new cellular standards place additional burdens on power amplifiers used for the transmitters, requiring operation that consumes relatively large amounts of power and generates large amounts of waste heat. Protecting the power amplifiers creates an opportunity for innovation.

SUMMARY

Aspects disclosed in the detailed description include a power amplifier with clamp and feedback protection circuitry. In an exemplary aspect, the power amplifier is initially protected by a fast-acting clamp circuit whose overall size is relatively limited. Subsequent operation allows a comparatively slowly acting feedback loop to dominate the protection of the power amplifier. By providing the two protection circuits, each optimized for a particular phase of protection, the overall size of associated protection circuitry may be diminished while still protecting the power amplifier from failure inducing conditions.

In this regard in one aspect, a power amplifier system is disclosed. The power amplifier system comprises a power amplifier stage comprising an input node and an output node. The power amplifier system also comprises a bias circuit coupled to the power amplifier stage and configured to provide a bias signal to the power amplifier stage. The power amplifier system also comprises a clamp coupled to the power amplifier stage, the clamp configured to limit a voltage level based on a first threshold. The power amplifier system also comprises a feedback protection loop coupled to the bias circuit and configured to detect an operating condition above a second threshold and send a signal to the bias circuit. The bias circuit is configured, responsive to the signal, to debias the power amplifier stage.

In another aspect, a power amplifier system is disclosed. The power amplifier system comprises a power amplifier stage. The power amplifier system also comprises a bias circuit coupled to the power amplifier stage and configured to provide a bias signal to the power amplifier stage. The power amplifier system also comprises an overtemperature feedback protection loop coupled to the bias circuit and configured to cause the bias circuit to debias the power amplifier stage when a threshold temperature is reached. The overtemperature feedback protection loop comprises a temperature sensor physically proximate the power amplifier stage. The overtemperature feedback protection loop also comprises a temperature independent voltage source. The overtemperature feedback protection loop also comprises a comparator coupled to the temperature sensor and the temperature independent voltage source.

DETAILED DESCRIPTION

Figure 1:
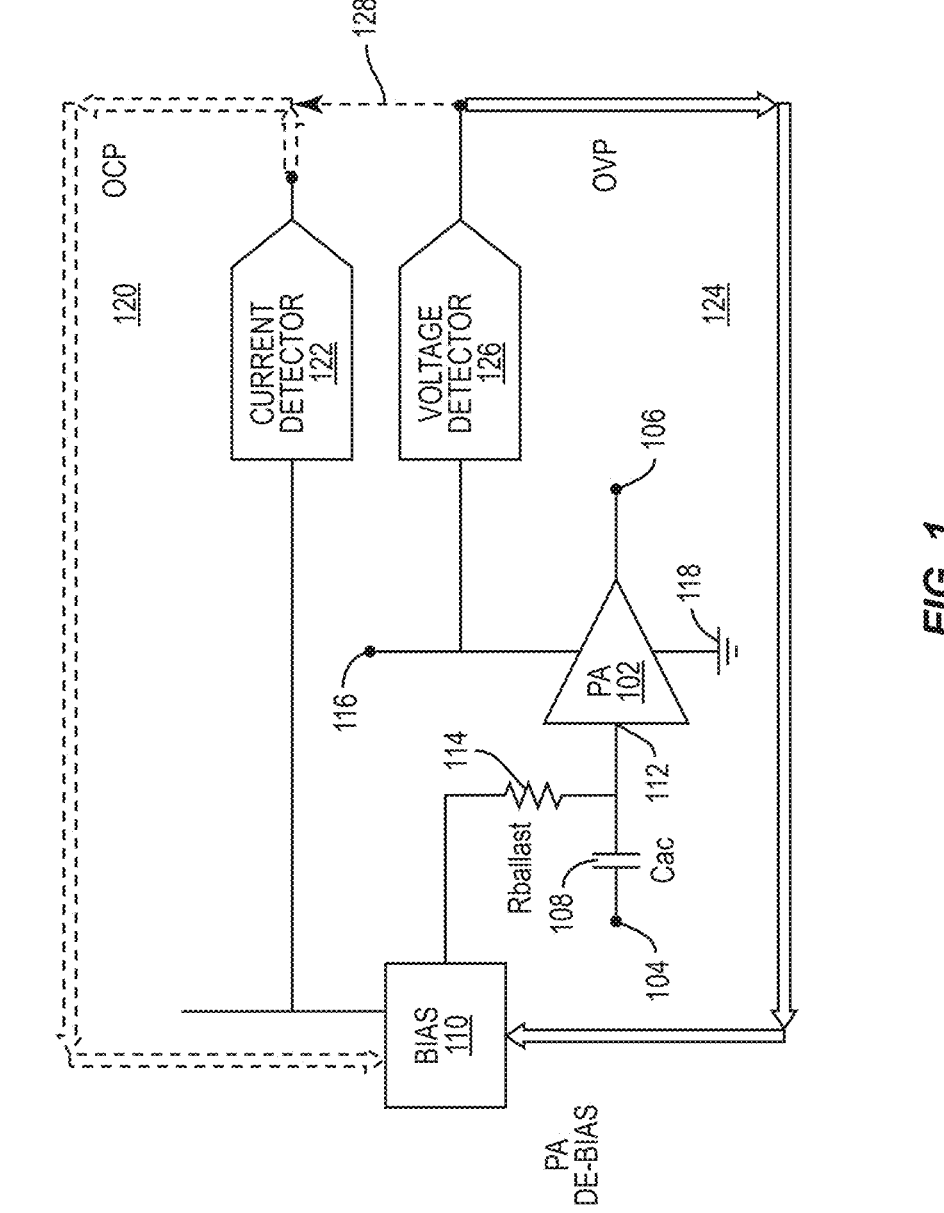
FIG. 1 is a block diagram of a conventional power amplifier with a feedback protection circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a power amplifier with clamp and feedback protection circuitry. In an exemplary aspect, the power amplifier is initially protected by a fast-acting clamp circuit whose overall size is relatively limited. Subsequent operation allows a comparatively slowly acting feedback loop to dominate the protection of the power amplifier. By providing the two protection circuits, each optimized for a particular phase of protection, the overall size of associated protection circuitry may be diminished while still protecting the power amplifier from failure inducing conditions.

Before addressing exemplary aspects of the present disclosure, a brief overview of traditional ways to protect a power amplifier are discussed with reference to FIGS. 1 and 2. A discussion of exemplary aspects of the present disclosure begins below with reference to FIG. 3.

In this regard, FIG. 1 is a block diagram of a power amplifier system 100 that includes a power amplifier stage 102 having an input node 104 configured to receive a radio frequency (RF) alternating current (AC) signal and an output node 106 configured to provide an amplified signal. A capacitor 108 blocks direct current (DC) signals at the input node 104 from reaching an input 112 of the power amplifier stage 102. A bias circuit 110 may be coupled to the input 112 of the power amplifier stage 102 through a ballast resistor 114. The power amplifier stage 102 may further be coupled to a supply voltage 116 and a ground 118.

The power amplifier stage 102 may be protected from runaway power conditions through a first feedback protection loop 120, which may include a current detector 122 that provides a signal to the bias circuit 110. When the current detector 122 detects a current at the bias circuit 110 above a predetermined threshold, the first feedback protection loop 120 may cause the bias circuit 110 to debias the power amplifier stage 102, thereby reducing the power used by the power amplifier stage 102.

Similarly, the power amplifier stage 102 may be protected from runaway power conditions through a second feedback protection loop 124, which may include a voltage detector 126 that provides a signal to the bias circuit 110. When the voltage detector 126 detects a voltage at the supply voltage 116 above a predetermined threshold, the second feedback protection loop 124 may cause the bias circuit 110 to debias the power amplifier stage 102, thereby reducing the power used by the power amplifier stage 102. Note that in some instances, the second feedback protection loop 124 may be combined with the first feedback protection loop 120 (denoted by arrow 128). The end result of such combination is still a signal being provided to the bias circuit 110 to debias the power amplifier stage 102.

Traditionally, the feedback protection loops 120, 124 are relatively slow acting. That is, the detectors 122, 126 must first detect the over threshold condition and then send the signal to the bias circuit 110. The bias circuit 110 in turn adjusts a voltage level or current level at the input 112 to lower the signal being amplified by the power amplifier stage 102. This adjustment takes time during which the power amplifier stage 102 may still generate sufficient heat to damage the power amplifier stage 102.

Figure 2:
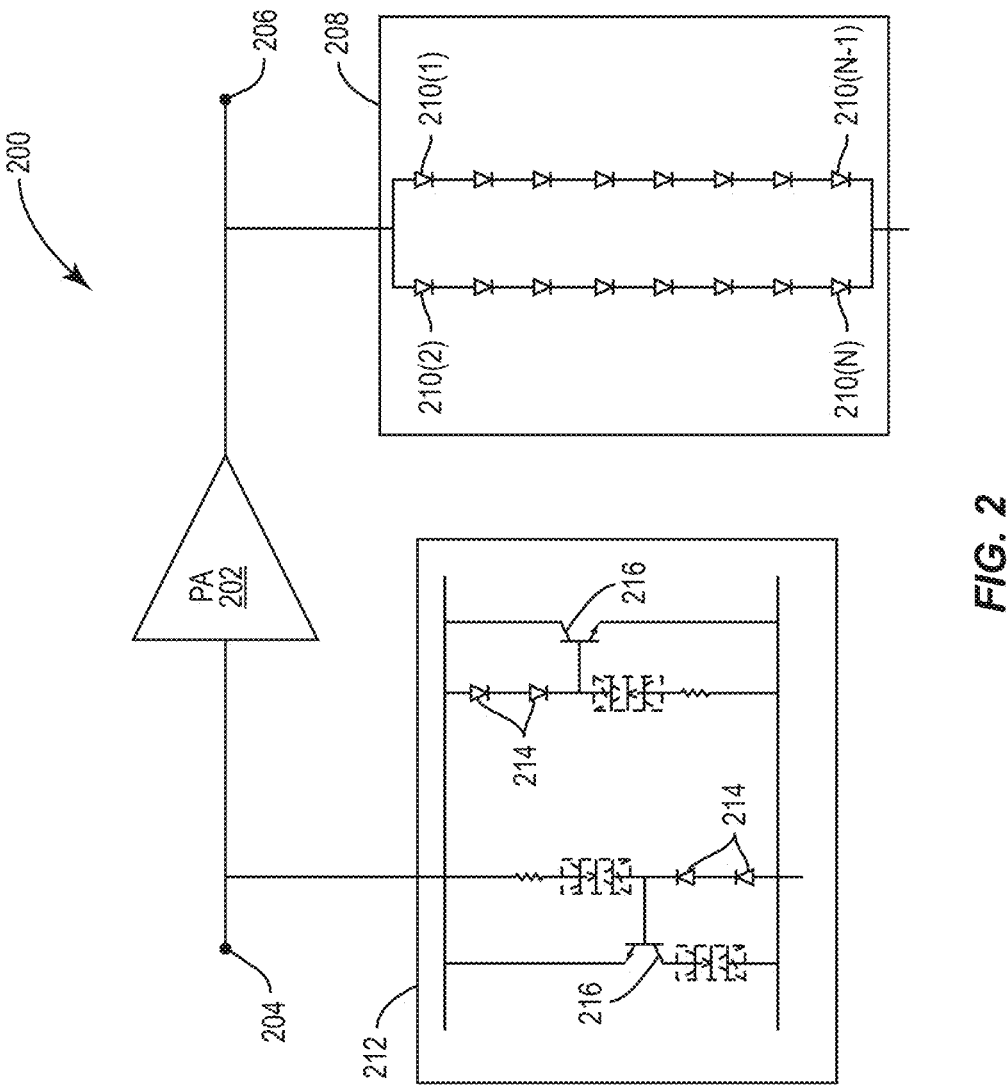
FIG. 2 is a block diagram of a conventional power amplifier with a clamp protection circuit.

Instead of using the feedback protection loops 120, 124, another traditional approach is through the use of a clamp at either an input or an output (or both) of a power amplifier stage as better illustrated by power amplifier system 200 in FIG. 2. In particular, the power amplifier system 200 may include a power amplifier stage 202 with an input node 204 and an output node 206. An output clamp 208 may be coupled to the output node 206. Traditionally, the output clamp 208 is formed from a plurality of stacked diodes 210(1)-210(N). Additionally, the power amplifier system 200 may include an input clamp 212 coupled to the input node 204. Note that where the power amplifier stage 202 is part of a chain of power amplifier stages (not shown), the input clamp 212 may be referred to as an interstage clamp and may also be coupled to an output of a prior power amplifier stage. The input clamp 212 may be formed from a plurality of diodes 214 and transistors 216. When sufficient diodes 210(1)-210(N) are gathered, the total space required to instantiate such diodes is relatively large, being, in many instances, equal in size to the power amplifier stage 202. However, the large size allows the clamps 208, 212 to be relatively fast acting to limit the voltage and current used by the power amplifier stage 202 and protecting the power amplifier stage 202 from harm. The downside of this fast acting protection is the aforementioned size and power consumption of the diodes.

Neither solution alone provides a perfect solution for the need to protect the power amplifier stage. Exemplary aspects of the present disclosure take the best of both solutions and combine them into a whole that exceeds the sum of its parts. Specifically, a relatively small, but fast acting output clamp may be used in conjunction with a relatively slow feedback protection loop. In particular, the feedback protection loop may activate at a first threshold, but the latency of the feedback protection loop means that the output power for the power amplifier stage will likely continue to rise, passing a second threshold associated with the clamp, where the second threshold is greater than the first threshold. When this second threshold is reached, the clamp quickly acts to limit the power to the second threshold. Since the second threshold is greater than the first threshold, the feedback protection loop continues to debias the power amplifier stage through the bias circuit, eventually bringing the power down to the first threshold such that the clamp is no longer active.

Figure 3:
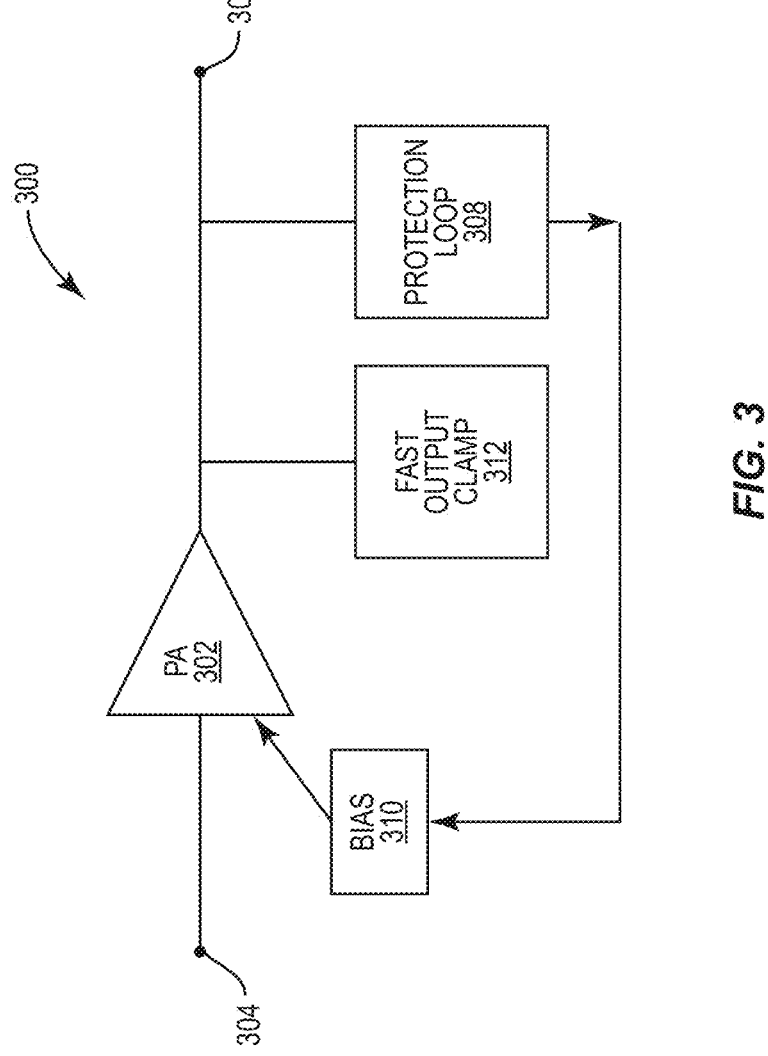
FIG. 3 is a block diagram of a power amplifier having a feedback protection circuit and an output clamp protection circuit according to an exemplary aspect of the present disclosure.

The general concept is shown by a power amplifier system 300 in FIG. 3. The power amplifier system 300 may include a power amplifier stage 302 with an input node 304 and an output node 306. A feedback protection loop 308 may be coupled to the power amplifier stage 302 at the output node 306 or other location depending on the nature of the feedback protection loop. The feedback protection loop 308 may act to cause a bias circuit 310 to debias the power amplifier stage 302 when a proxy for the power level (e.g., a voltage level, a current level, a temperature, or an actual power level) exceeds a first threshold. An output clamp 312 may also be associated with or coupled to the output node 306. The output clamp 312 is comparatively fast relative to the feedback protection loop 308 but is activated when the power level at the output node 306 exceeds a second threshold. The power level at the output node 306 is higher at the second threshold than the power level at the output node 306 when the first threshold is reached even if the first threshold is not directly compared to the power level at the output node 306.

Thus, in operation, as the power consumed by the power amplifier stage 302 increases (as measured by a proxy or an actual power level), the first threshold will be passed and the feedback protection loop 308 will begin to instruct the bias circuit 310 to debias the power amplifier stage 302. However, this feedback protection loop 308 is relatively slow, so the power consumed by the power amplifier stage 302 will continue to increase until it reaches the second threshold and the output clamp 312 begins to limit the power consumption. Because the second threshold is relatively high and because the output clamp 312 does not have to limit the power for an extended period of time, the size of the output clamp 312 may be relatively small (e.g., fewer stacked diodes). Before the output clamp 312 fails, the feedback protection loop 308 will have had time to debias the power amplifier stage 302 sufficiently to prevent damage to the power amplifier stage 302 and the output clamp 312 may turn off. Note that the thresholds may be programmable and their relationship can be adjusted through such programming. Specifically, switches may switch in/out diodes within a diode stack within the output clamp 312. Such switching may be controlled by a control circuit (not shown). The control circuit may further adjust a value within a register that is used by a comparator within the feedback protection loop 308. Other ways of programming the thresholds may also be used without departing from the present disclosure.

Figure 4:
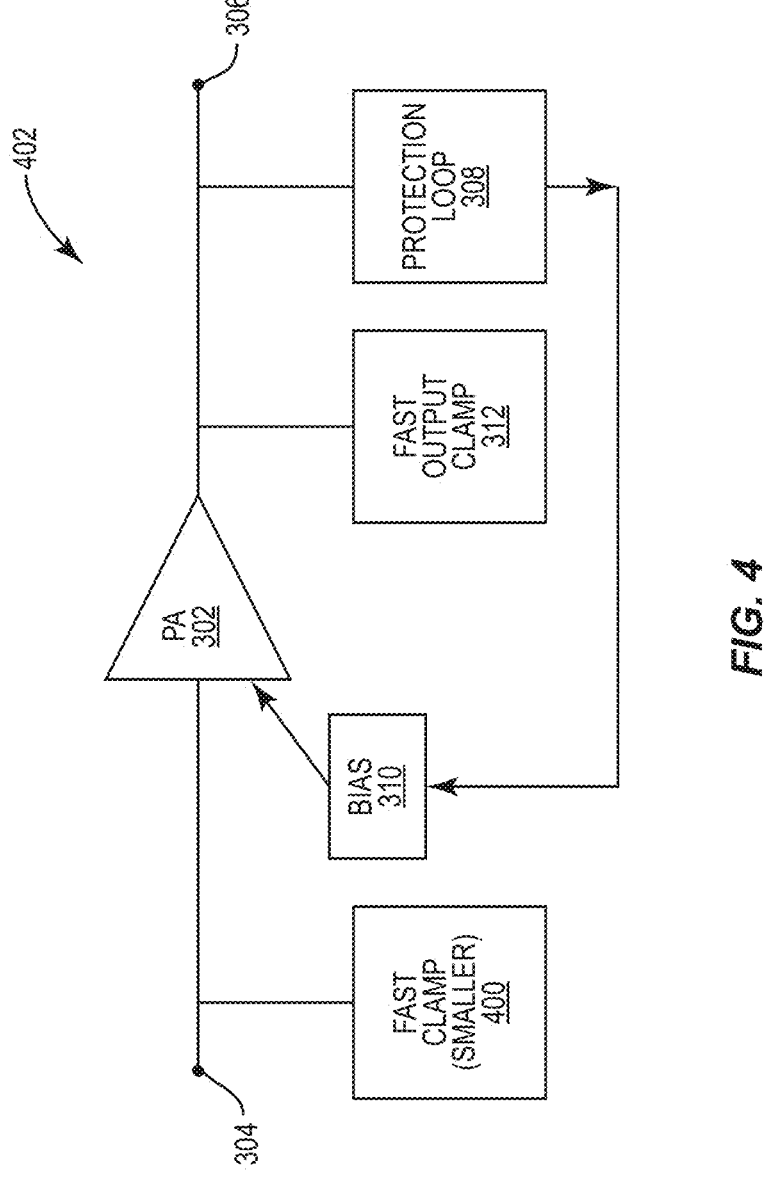
FIG. 4 is a block diagram of a power amplifier having a feedback protection circuit and two clamp protection circuits according to an exemplary aspect of the present disclosure.

There are many variations of this hybrid protection scheme. For example, as shown in FIG. 4, an input clamp 400 to form a power amplifier system 402. Other elements remain identical, but the input clamp 400 may likewise be a small, fast clamp.

Figure 5:
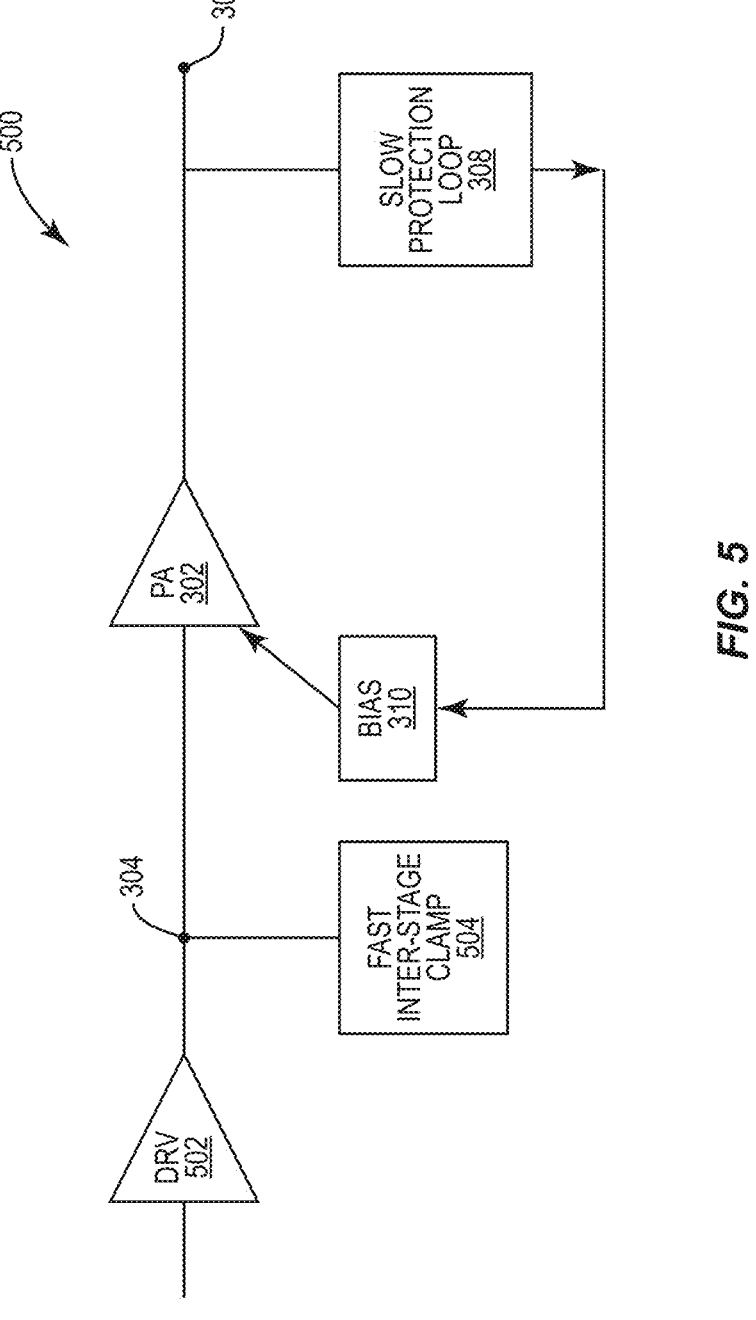
FIG. 5 is a block diagram of a power amplifier having a feedback protection circuit and an input clamp protection circuit according to an exemplary aspect of the present disclosure.

Another exemplary aspect is a power amplifier system 500 shown in FIG. 5. In particular, a driver amplifier stage 502 is added before the input node 304 making the input clamp an interstage clamp 504, although functionally the interstage clamp 504 may be identical to the input clamp 400.

Figure 6:
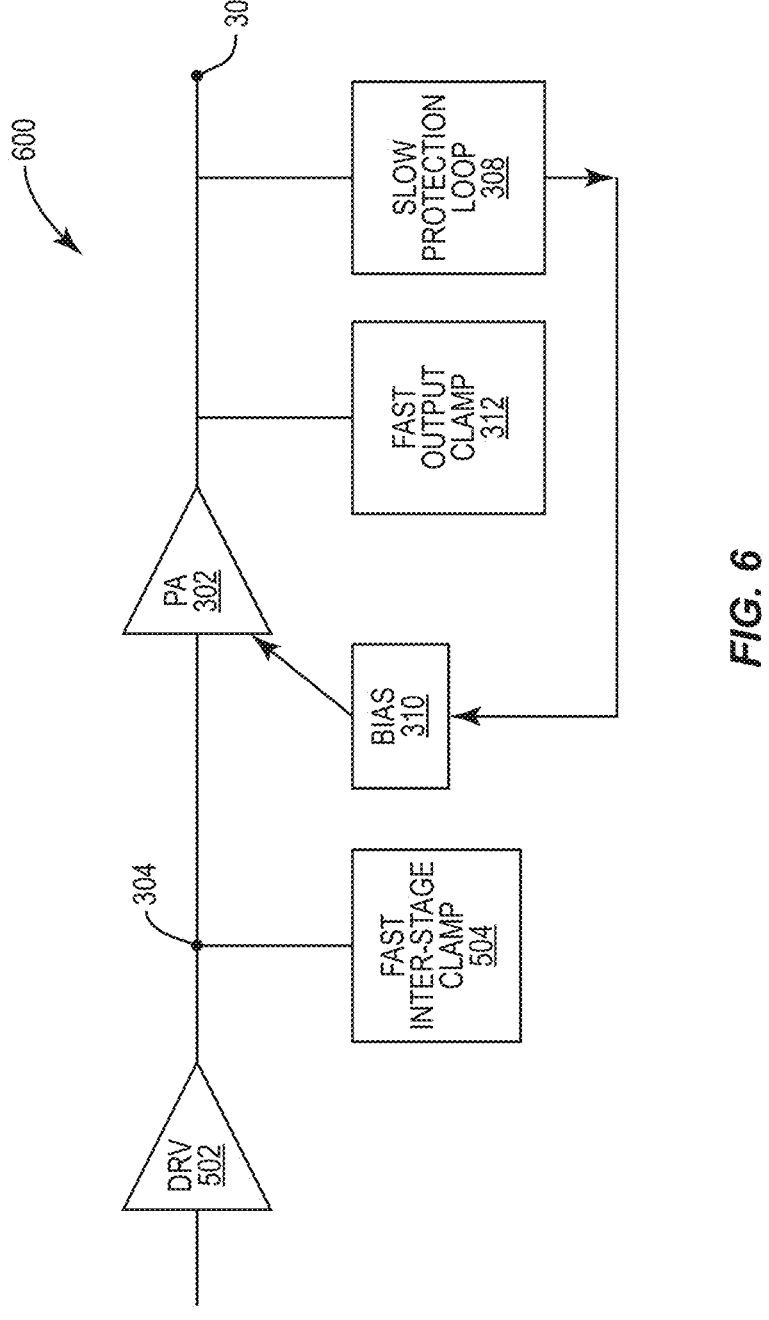
FIG. 6 is a block diagram of a multi-stage power amplifier having a feedback protection circuit and two clamp protection circuits according to an exemplary aspect of the present disclosure.

FIG. 6 illustrates a similar power amplifier system 600, which includes the driver amplifier stage 502 and the interstage clamp 504 as well as the output clamp 312. The clamps 312 and 504 may have different thresholds or the same threshold, and in either case, the threshold(s) are above the first threshold of the feedback protection loop 308.

While the above discussion illustrates only a single generic feedback protection loop 308, it should be appreciated that the feedback protection loop 308 may be an overcurrent protection loop, an overvoltage protection loop, an overpower protection loop, or an overtemperature protection loop. More details about such protection loops may be found in commonly owned U.S. Pat. No. 12,155,353, which is hereby incorporated by reference in its entirety. Further, instead of a just a single feedback protection loop 308, there may be multiple feedback protection loops. For example, both an overcurrent and an overvoltage protection feedback protection loop may be present (or combined into a single loop).

Figure 7:
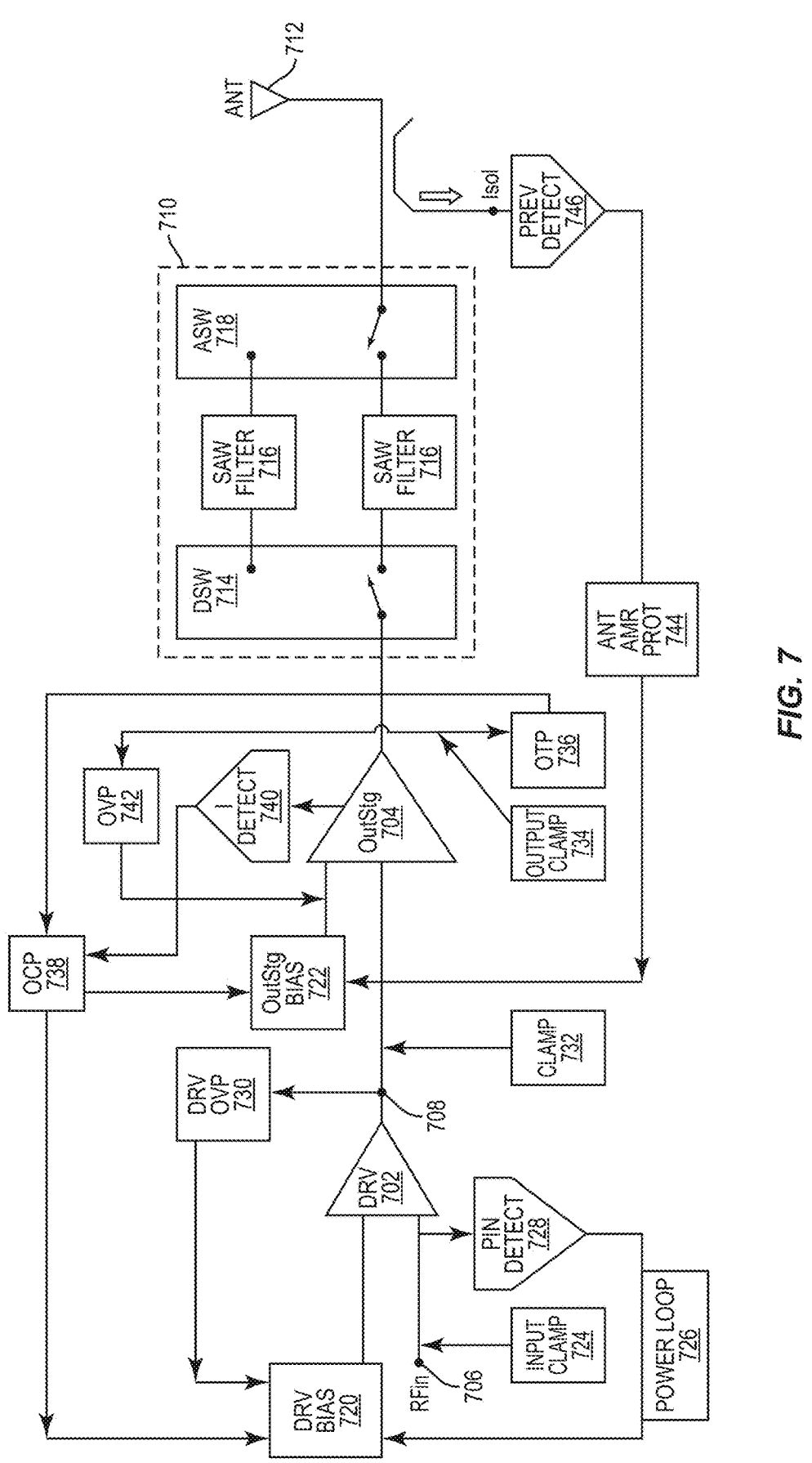
FIG. 7 is a block diagram of a multi-stage power amplifier having a plurality of feedback protection circuits and a plurality of clamp protection circuits according to an exemplary aspect of the present disclosure.

An exemplary power amplifier system 700, illustrated in FIG. 7 shows how myriad feedback protection loops and clamps may be used in harmony. In particular, the power amplifier system 700 may have a first power amplifier stage 702, which may be a driver amplifier stage and a second power amplifier stage 704, which may be an output amplifier stage. The first power amplifier stage 702 may be coupled to an input node 706 that receives an RF input signal (RFin) to be amplified. While not shown, a DC blocking capacitor may be present between the input node 706 and the first power amplifier stage 702. An output of the first power amplifier stage 702 may be coupled to an input of the second power amplifier stage 704 with a node 708 therebetween. Again, a DC blocking capacitor (not shown) may be present between the first power amplifier stage 702 and the second power amplifier stage 704. The output of the second power amplifier stage 704 may be coupled to a switching and filter circuit 710. The switching and filter circuit 710 may be coupled to an antenna 712. Further, the switching and filter circuit 710 may include a distribution switch (DSW) 714, one or more filters 716 such as surface acoustic wave (SAW) filters, and an antenna switch 718. The switches 714, 718 may switch between frequency bands, cellular modes (e.g., 5G-NR versus 4G LTE), between transmit and receive modes, or the like and are not central to the present disclosure. The first power amplifier stage 702 may be biased by a first bias circuit 720. The second power amplifier stage 704 may be biased by a second bias circuit 722.

The first power amplifier stage 702 may be protected by a first input clamp 724, which is relatively small and relatively fast. The first power amplifier stage 702 may further be protected by a power feedback protection loop 726 that detects an input power (Pin) with a Pin detector 728. If Pin is above a first threshold, a signal may be provided to the first bias circuit 720 to debias the first power amplifier stage 702. As described above, the first threshold may be lower than a second threshold at which the first input clamp 724 activates. The first power amplifier stage 702 may also be protected by a second feedback protection loop 730, which may, for example, be an overvoltage protection (OVP) loop. When the second feedback protection loop 730 detects voltage above a third threshold as a proxy for a power level, the second feedback protection loop 730 may send a signal to the first bias circuit 720 to debias the first power amplifier stage 702. The third threshold is likewise chosen to be lower than the second threshold of the first input clamp 724.

The second power amplifier stage 704 may be protected by a clamp 732. Note that while the clamp 732 is an output clamp for the first power amplifier stage 702, it is an input or interstage clamp for the second power amplifier stage 704. As such the clamp 732 may protect both power amplifier stages 702 and 704. Note that the threshold at which the clamp 732 turns on may be above the first and third thresholds. The second power amplifier stage 704 may also be protected by an output clamp 734. The second power amplifier stage 704 may also be protected by an overtemperature feedback protection loop 736, which provides an overtemperature condition signal to the second bias circuit 722 or to an overcurrent feedback protection loop (OCP) 738. The OCP loop 738 may receive a current signal from a current detector 740. Based on the current signal and/or the overtemperature condition signal, the OCP loop 738 may send a signal to the second bias circuit 722 to debias the second power amplifier stage 704. The second power amplifier stage 704 may also be protected by an overvoltage feedback protection loop (OVP) 742. Again, the thresholds at which the feedback protection loops 736, 738, 742 activate may be lower than the threshold of the clamps 732, 734.

Additionally, a power feedback protection loop 744 may measure reflected or reverse power (Prev) with a detector 746 and provide a signal to the bias circuit 722. Note that not all of the feedback protection loops 726, 730, 736, 738, 742 need be present. Likewise, additional feedback protection loops (e.g., an overtemperature feedback protection loop for the first power amplifier stage 702) may be present without departing from the scope of the present disclosure.

Figure 8:
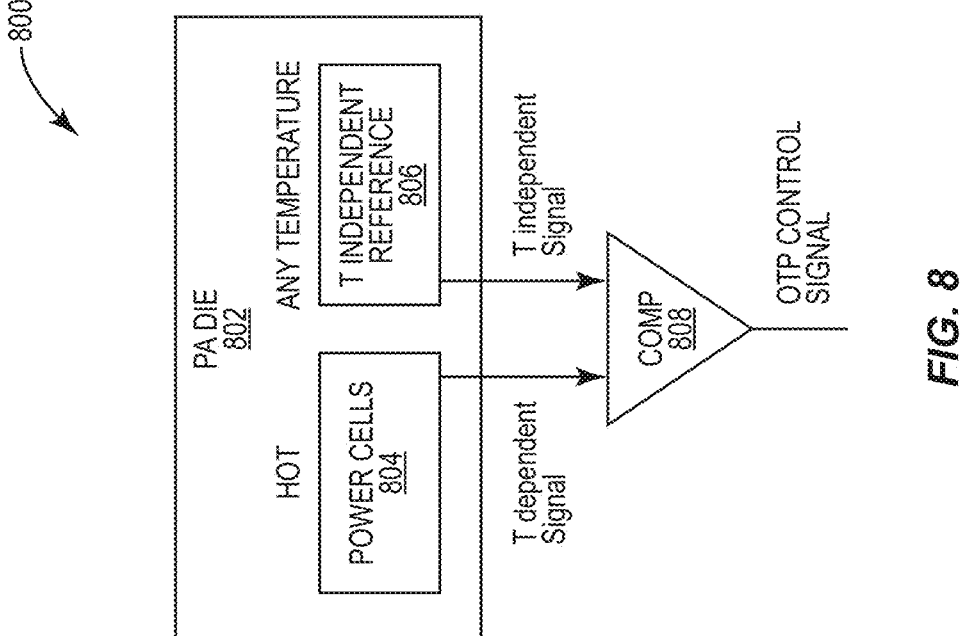
FIG. 8 is a block diagram of an over-temperature protection circuit that may be used alone or in combination with the clamp circuit of the present disclosure.
Figure 9:
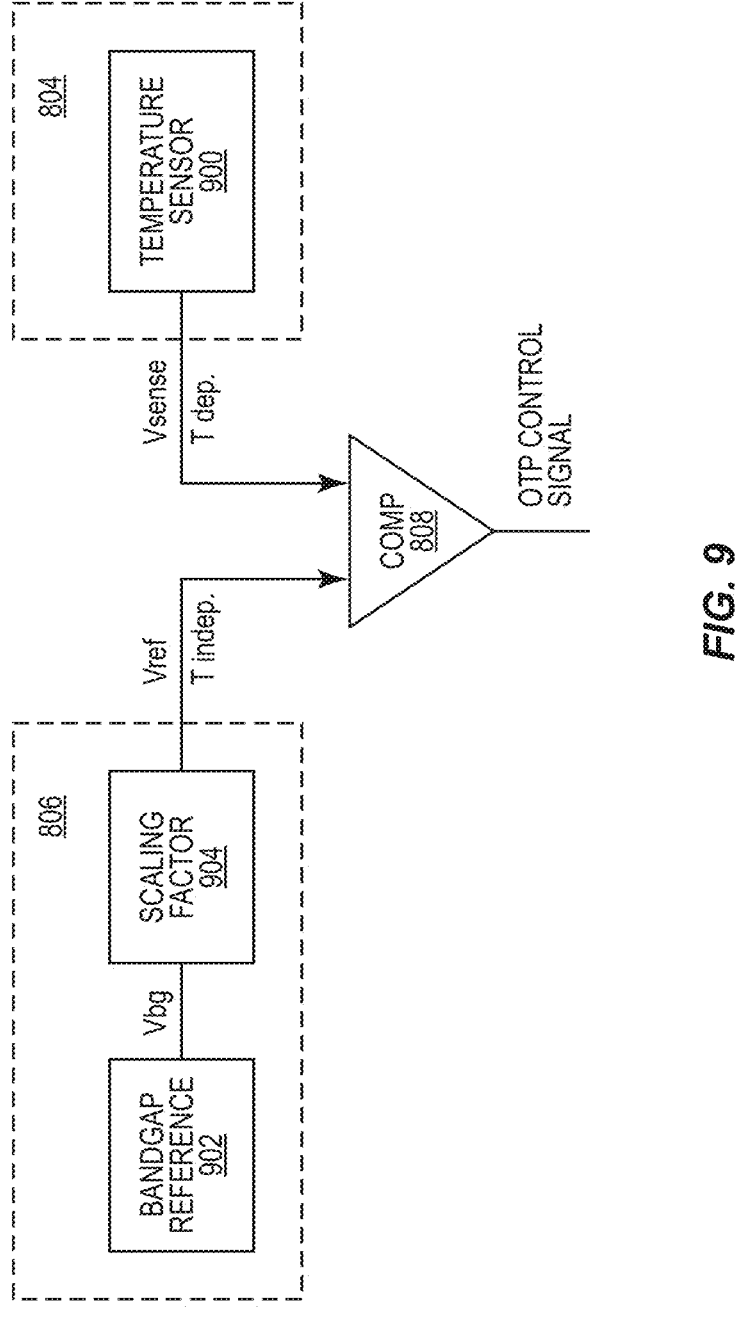
FIG. 9 is a block diagram expanding on the reference circuit of FIG. 8 according to a first exemplary aspect.

While the previously incorporated '353 patent provides many possible feedback protection loop details, the present disclosure also provides an exemplary overtemperature protection (OTP) loop as described with reference to FIGS. 8-11. FIG. 8 illustrates such an OTP loop 800 where a power amplifier die 802 has relatively hot power cells 804 (e.g., the power amplifier stages) and a temperature circuit 806. The power cells 804 provide a temperature dependent signal to a comparator 808. The temperature circuit 806 provides a temperature independent reference signal to the comparator 808. Based on a delta between the signals, the comparator 808 may generate an OTP control signal. Additional details are provided in FIG. 9, where the power cells 804 may include a temperature sensor 900 to provide the temperature dependent signal to the comparator 808. The temperature circuit 806 may include a bandgap reference circuit 902 and a scaling factor circuit 904.

Figure 10:
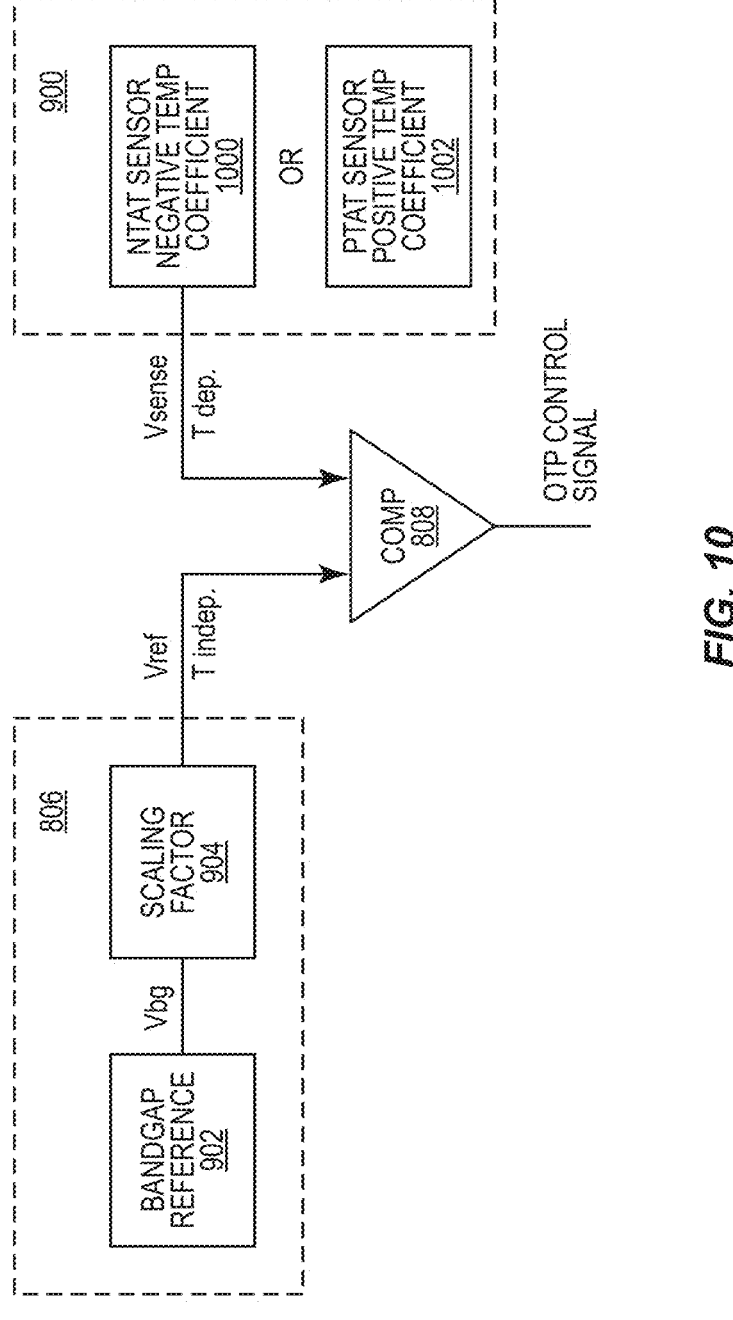
FIG. 10 is block diagram providing an alternate sensing circuit for the circuit of FIG. 8.

As illustrated in FIG. 10, the temperature sensor 900 may be a proportional-to-absolute temperature (PTAT) sensor

1000 that is designed to provide decreasing voltage with increased device temperature (sometimes referred to as NTAT) or may be a PTAT sensor 1002 that is designed to provide an increasing voltage with increased device temperature.

Figure 11:
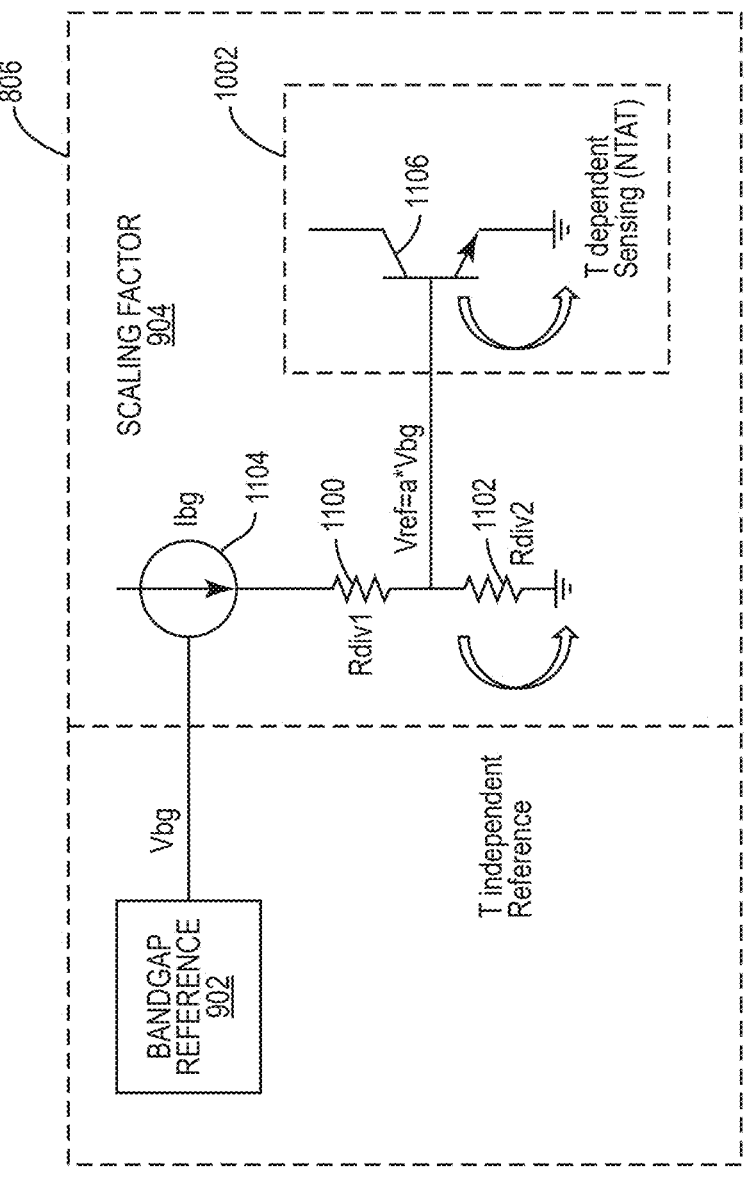
FIG. 11 is a circuit diagram showing how a resistor divider may be used to scale the reference circuit of FIG. 8.

Additional exemplary details about a possible scaling factor circuit 904 are provided in FIG. 11, where a resistor divider circuit formed from resistors 1100 and 1102 are coupled to a current source 1104 and a transistor 1106 that forms the sensor 1002. The current source 1104 is controlled by the bandgap reference circuit 902 and an NTAT signal is provided by the transistor 1106.

As a further note, aspects of the present disclosure may be single ended (as illustrated above), differential, quadrature, or the like. Further, aspects of the present disclosure may be implemented through n-type material field effect transistors (FETs) (NFETs), p-type material FETs (PFETs), complementary metal oxide semiconductor (CMOS) FETs, bipolar junction transistors (BJTs), or the like. Further, aspects of the present disclosure may be made using gallium nitride (GaN), gallium arsenide (GaAs), silicon carbide (SiC) materials. Further, aspects of the present disclosure may be formed on silicon, silicon on insulator (SOI), silicon on sapphire (SOS), glass, or other substrates.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A power amplifier system comprising:
   a power amplifier stage comprising an input node and an output node;
   a bias circuit coupled to the power amplifier stage and configured to provide a bias signal to the power amplifier stage;
   a first clamp coupled to the output node of the power amplifier stage, the first clamp configured to limit a voltage level based on a first threshold;
   a second clamp coupled to the input node of the power amplifier stage, the second clamp configured to limit a second voltage level based on a third threshold; and a protection feedback loop coupled to the bias circuit and configured to detect an operating condition above a second threshold and send a signal to the bias circuit, wherein the bias circuit is configured, responsive to the signal, to debias the power amplifier stage by either:

lowering the second voltage level below the third threshold or lowering a current level at the input node of the power amplifier stage; and wherein the first clamp and the second clamp throttle voltage levels for the power amplifier stage faster than the protection feedback loop.

2. The power amplifier system of claim 1, wherein the first clamp comprises a plurality of stacked diodes.

3. The power amplifier system of claim 1, wherein the first threshold, the second threshold, and the third threshold are proxies for overpower conditions and the second threshold is lower than the first threshold.

4. The power amplifier system of claim 1, wherein the first clamp is configured to turn off when the protection feedback loop begins reducing power within the power amplifier stage.

5. The power amplifier system of claim 1, wherein the protection feedback loop comprises an overvoltage protection feedback loop.

6. The power amplifier system of claim 1, wherein the protection feedback loop comprises an overcurrent protection feedback loop.

7. The power amplifier system of claim 1, wherein the protection feedback loop comprises an overtemperature protection feedback loop.

8. The power amplifier system of claim 1, wherein the protection feedback loop comprises an overpower protection feedback loop.

9. The power amplifier system of claim 1, further comprising a second power amplifier stage coupled to the input node.

10. The power amplifier system of claim 1, wherein the protection feedback loop comprises a plurality of protection feedback loops selected from the group consisting of: an overcurrent protection feedback loop, an overvoltage protection feedback loop, an overtemperature protection feedback loop, and an overpower protection feedback loop.

11. The power amplifier system of claim 1, wherein the first threshold and the second threshold are configured to be programmed dynamically.

12. The power amplifier system of claim 1, wherein the protection feedback loop comprises an overtemperature protection feedback loop coupled to the bias circuit and configured to cause the bias circuit to debias the power amplifier stage when a threshold temperature is reached, the overtemperature protection feedback loop comprising:

a temperature sensor physically proximate the power amplifier stage;

a temperature independent voltage source; and a comparator coupled to the temperature sensor and the temperature independent voltage source.

13. The power amplifier system of claim 12, further comprising a second protection feedback loop coupled to the bias circuit.

14. The power amplifier system of claim 13, wherein the comparator is coupled to the second protection feedback loop.

\* \* \* \* \*